United States Patent [19]

Nishinoiri et al.

[11] Patent Number: 4,873,170
[45] Date of Patent: * Oct. 10, 1989

[54] METHOD FOR MAKING LITHOGRAPHIC PRINTING PLATE

[75] Inventors: Hiroshi Nishinoiri; Masahiko Saikawa; Yoshikazu Takaya; Euji Kanada, all of Nagaokakyo, Japan

[73] Assignee: Mitsubishi Paper Mills, Ltd., Tokyo, Japan

[*] Notice: The portion of the term of this patent subsequent to Nov. 15, 2005 has been disclaimed.

[21] Appl. No.: 82,318

[22] Filed: Aug. 6, 1987

[30] Foreign Application Priority Data

Aug. 14, 1986 [JP] Japan .................................. 61-191475
Apr. 17, 1987 [JP] Japan .................................... 62-94497

[51] Int. Cl.$^4$ ............................ G03C 5/54; G03F 7/06
[52] U.S. Cl. ..................................... 430/204; 430/230; 430/944
[58] Field of Search ......................... 430/204, 230, 944

[56] References Cited

U.S. PATENT DOCUMENTS

| | | | |
|---|---|---|---|
| 4,144,064 | 3/1979 | Vermeulen et al. | 430/204 |
| 4,501,811 | 2/1985 | Saikawa et al. | 430/204 |
| 4,603,100 | 7/1986 | Boston | 430/204 |
| 4,621,041 | 11/1986 | Saikawa et al. | 430/204 |
| 4,770,961 | 9/1988 | Tunaka et al. | 430/204 |

*Primary Examiner*—Richard L. Schilling
*Attorney, Agent, or Firm*—Cushman, Darby & Cushman

[57] ABSTRACT

There is provided a method for making a lithographic printing plate having high sensitivity, resolving power and printing endurance and free from scumming utilizing silver complex diffusion transfer process which comprises subjecting to scanning exposure of high-intensity short-time a light sensitive material comprising a support and, provided thereon, at least a silver halide emulsion layer and a physical development nuclei layer as a surface layer and then developing it with a silver complex diffusion transfer developer, the improvement which comprises subjecting the light sensitive material to imagewise exposure with scanning light of at least 700 nm, said emulsion layer containing silver halide grains mainly composed of silver chloride and a sensitizing dye having a sensitivity maximum in the long wavelength region of at least 700 nm in an amount of $3 \times 10^{-5} - 3 \times 10^{-4}$ mol for 1 mol of silver halide and an antihalation means being provided below said emulsion layer to provide a reflectance of 13-40% for the scanning exposure light of at least 700 nm.

7 Claims, No Drawings

METHOD FOR MAKING LITHOGRAPHIC PRINTING PLATE

BACKGROUND OF THE INVENTION

This invention relates to a process for making a lithographic printing plate by silver complex diffusion transfer process wherein laser beams, especially semiconductor laser beam are used as a light source.

A lithographic printing plate which utilizes as ink receptive areas a transferred silver image as produced by the silver complex diffusion transfer process has already been disclosed and well known in Japanese Patent Examined Publication (Kokoku) No. 30562/73 and Japanese Patent Unexamined Publication (Kokai) Nos. 21602/78, 103104/79, 9750/81, etc.

According to a typical silver complex diffusion transfer process suitable for making a lithographic printing plate, a light sensitive material comprising a support and provided successively thereon, a subbing layer which also serves as an antihalation layer, a silver halide emulsion layer and a physical development nuclei layer is subjected to an imagewise exposure and then development treatment to result in conversion of the silver halide of a latent image portion to a black silver in the emulsion layer. Simultaneously, silver halide of the area other than the latent image dissolves by the action of a silver halide complexing agent contained in the developer and diffuses toward the surface of the light sensitive material. The dissolved and diffused silver complex is precipitated by the reducing action of the developing agent as a silver image on the physical development nuclei in the surface layer. After the development, if necessary, the silver image thus obtained is subjected to sensitization treatment to enhance its ink receptivity. Then, the plate is set in an offset printing machine and inked image is transferred to a material to be printed.

In the conventional process, the silver halide emulsion layer is spectrally sensitized with a merocyanine dye, cyanine dye, etc. so as to have a sensitivity maximum at around 550 nm in the green region and this is exposed in a process camera to an ordinary light source such as tungsten bulb for several seconds to several tens of seconds. However, said conventional process has still limitations in sharpness and resolving power, even if said lithographic printing plate which is inherently excellent in sharpness and resolving power is used. Besides, in reproducing a color print from a color original, the conventional process still has problems in making the light sensitive material and lithographic printing plates in addition to the insufficient resolving power or the like.

At present, there has been proposed a process of plate making with laser beams in an attempt to solve the above problems. For example, U.S. Pat. No. 4,501,811, Japanese Patent Unexamined Publication (Kokai) Nos. 71055/84, 75838/85, 100148/85, etc. disclose use of helium-neon laser or light-emitting diodes for making lithographic printing plates. As also disclosed in these patent publications, in the lithographic printing plates made by the silver complex diffusion transfer process, the surface physical development nuclei layer greatly affects the spectral sensitization and, as a result, there is a decrease in the sensitivity to a laser beam employed or deterioration in the shelf stability. Further, since the silver complex diffusion transfer process produces a transferred and precipitated silver image of soft gradation, there occur a decrease in sharpness and resolution of the image, scumming, and wearing-off of the silver image during printing. This results in insufficient printing endurance and the desired lithographic printing plates of good quality are difficult to make.

Japanese Patent Unexamined Publication (Kokai) No. 75838/35 discloses that in making lithographic printing plates with helium-neon laser beam of 632.8 nm, resolving power and printing endurance can be improved by providing an antihalation layer of 10 or less in reflectance.

Methods which employ laser sources such as helium-neon, argon, etc. as light sources for scanning exposure have the defects that although high output can be obtained, devices are of large size and expensive and besides consumption power efficiency is low. On the other hand, semiconductor laser is small in size, inexpensive, easy in modulation and long in shelf life. As the semiconductor lasers, there are used semiconductors of such systems as Ga/As/P; Ga/Al/As; Ga/As; In/P; In/As, etc. Wavelengths of these laser beams are generally longer than 700 nm and mostly longer than 750 nm. Light sensitive materials for lithographic printing plates which use semiconductor laser beams of such longer wavelength as light sources for imagewise exposure are disclosed, for example, in Japanese Patent Unexamined Publication (Kokai) No. 61752/85. This patent publication discloses, as an especially preferable embodiment, a light sensitive material for lithographic printing plates which comprises a support and, successively provided thereon, a non-silver light sensitive layer (e.g., a light sensitive layer comprising o-naphthoquinone diazide) capable of forming an oleophilic image and a light sensitive silver halide emulsion layer and also discloses sensitizing dyes represented by the general formula (I)-IV) having sensitivity maxima in the range of wavelength longer than 700 nm which are used in said emulsion layer.

The light sensitive materials for lithographic printing plates having a silver halide emulsion layer containing such sensitizing dyes, an antihalation layer of 10% or less in reflectance for semiconductor laser diode beam of near infrared region and a surface physical development nuclei layer have sufficient printing endurance, but are very low in sensitivity to laser diode radiation and increase of reflectance of the antihalation layer in an attempt to increase the sensitivity to some extent results in deterioration of printing endurance. Thus, it has been very difficult to satisfy all of high sensitivity, high resolving power and high printing endurance.

SUMMARY OF THE INVENTION

The object of this invention is to provide a method for making a lithographic printing plate utilizing the silver complex diffusion transfer process which has such a high sensitivity that a low output semiconductor laser beam can be employed and further has high resolving power and printing endurance and is free from scumming.

The above object has been accomplished by a method for making a lithographic printing plate which comprises subjecting to scanning exposure of high-intensity short-time a light sensitive material comprising a support and, provided thereon, at least a silver halide emulsion layer and a physical development nuclei layer as a surface layer and then developing it with a silver complex diffusion transfer developer, characterized in that an antihalation means is provided below said emulsion layer to provide a reflectance of 13–40% for the scanning exposure beam of at least 700 nm and said emulsion layer contains silver halide grains mainly composed of silver chloride and a sensitizing dye having sensitivity maxima in the long wavelength region of at least 700 nm in an amount of $3 \times 10^{-5}$ to $3 \times 10^{-4}$ mol per one mole of the silver halide and this light sensitive material is subjected to imagewise scanning exposure of at least 700 nm.

DETAILED EXPLANATION OF THE INVENTION

The supports used for the lithographic printing plates according to this invention can be, for example, paper; films such as cellulose acetate film, polyvinyl acetal film, polystyrene film, polypropylene film, polyethylene terephthalate film, etc.; composite film such as polyester, polypropylene or polystyrene film coated with polyethylene film; metals; metallized paper; or metal/paper laminates. A paper support coated on one or both sides of α-olefin polymer, e.g., polyethylene is also useful.

It is preferred to provide an undercoat layer between the support and the silver halide emulsion layer. Further, a backing layer may be provided on the side where the emulsion layer is not present.

At least one of undercoat layer, support and backing layer is provided with antihalation means to reflect 13–40% of scanning exposure light, for example, laser diode beam of 780 nm to the emulsion layer. More preferred reflectance is 14–35%.

The above mentioned antihalation is for increase of sensitivity as compared with that of 3% or 8% in reflectance as disclosed in the aforementioned Japanese Patent Unexamined Publication (Kokai) No. 75838/85 and unexpectedly, it has been found that reduction of resolving power caused by use of laser scanning type exposure can be practically ignored. However, there is still the effect that printing endurance for fine line images is inferior.

It has been found that when the limitation of amount of sensitizing dye having the sensitivity maxima in the region of 700 nm or longer to the range of $3 \times 10^{-5}$–$3 \times 10^{-4}$ mol per one of silver halide as combined with said antihalation means, high sensitivity fully adaptable to laser diode output device can be attained and the problem of reduction of printing endurance can be solved and thus, lithographic printing plates of high printing endurance and resolving power can be obtained.

More preferred amount of the sensitizing dye is $4 \times 10^{-4}$–$2 \times 10^{-4}$ mol per one mol of silver halide.

For antihalation applied to at least one of undercoat layer, support and backing layer in this invention, there may be used substances capable of absorbing laser beams of 700 nm or more, preferably 750 nm or more, for example, black pigments such as carbon black, penta- or heptamethineoxonol dyes, etc.

The antihalation is preferably applied to at least the undercoat layer contiguous to the emulsion layer.

It is preferred that the light sensitive material for lithographic printing plates used in this invention is made to have a reflectance of 13% –40% to scanning exposure means by containing fine powders (matting agent) of 2-10 μm in average particle size in the emulsion layer or/and the undercoat layer and a white pigment and a light absorber in said undercoat layer. This reflectance is that obtained when the white pigment and the light absorber are used and, if necessary, the fine powders are further combined therewith. It is preferred that a reflectance of about 10%–about 30% is attained only with the light absorber and the final reflectance of 13%–40% is attained by adding the reflection by the white pigment, etc. In general, amount of the white pigment is about 0.3 g to about 5 g, preferably about 0.5 g to about 4 g per 1 m² of undercoat layer and amount of the fine powders is about 0.1 g to about 3 g, preferably about 0.2 g to about 2 g per 1 m² of the undercoat layer or/and emulsion layer.

It is known to combine a white pigment such as titanium dioxide in order to prevent desensitization caused by carbon black as disclosed in, for example, U.S. Pat. No. 4,144,064, Japanese Patent Unexamined Publication (Kokai) No. 19942/84, etc. with reference to light sensitive materials for production of block copy originals.

It is also known to use fine powders in undercoat layer of lithographic printing plate to be exposed to laser beams as disclosed in, for example, Japanese Patent Unexamined Publication (Kokai) No. 100147/75.

However, even if the antihalation by the high reflectance attained by use of a large amount of white pigment and a small amount of light absorber as disclosed in said Japanese Patent Unexamined Publication (Kokai) No. 19942/84 is applied to the undercoat layer disclosed in said Japanese Patent Unexamined Publication (Kokai) No. 100147/85, high printing endurance cannot be obtained, though sensitivity can be enhanced.

According to the preferred embodiment of this invention referred to above, it is possible to obtain sensitivity higher than and printing endurance equal to or higher than the antihalation layer of the lithographic printing plate disclosed in said Japanese Patent Unexamined Publication (Kokai) No. 75838/85. This result is considered due to enhancement of sensitivity by increase of reflectance resulting primarily from reduction in the amount of light absorber and secondarily from use of a white pigment and further due to the structure where the white pigment is densely dispersed between the fine powders whereby there result sufficient adhesion strength of transferred precipitated silver and increase in retention of damping solution in addition to prevention, by the white pigment, of reduction of printing endurance caused by reduction of the amount of the light absorber.

The white pigments used in this invention are those of 0.01-1 μm in average particle size such as titanium dioxide, zinc oxide, calcium carbonate, etc. and preferable is titanium dioxide (either of rutile-type and anatase-type may be used).

The fine powders used in this invention are those of 2-10 μm in average particle size such as silica, starch, polymethyl methacrylate, etc. and silica is preferred.

The sensitizing dyes used in this invention which have a sensitivity maxima in the region of 700 nm or longer can be those mentioned in, for example, U.S. Pat. Nos. 2,095,854, 2,095,856, 2,955,939, 3,482,978, 3,552,974, 3,573,931, 3,582,344, 3,623,811, etc.

Preferably, those represented by the following general formulas (I)–(IV) may be used.

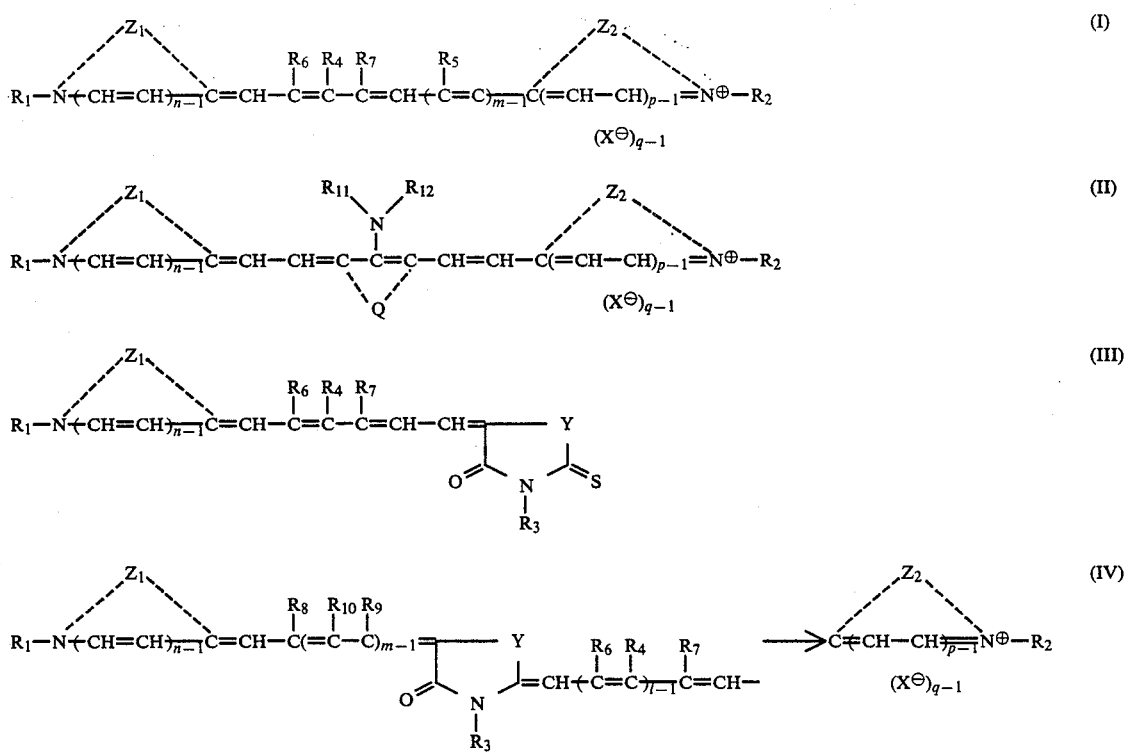

In the general formulas (I)–(IV), $Z_1$ and $Z_2$ which may be identical or different represent atom groups necessary for formation of 5-membered or 6-membered nitrogen containing heterocyclic ring. $R_1$ and $R_2$ which may be identical or different represent alkyl group or alkenyl group. $R_3$ represents alkyl group, alkenyl group or aryl group. $R_4$–$R_{10}$ which may be identical or different represent hydrogen atom, halogen atom, alkyl group, aryl group or alkoxy group and $R_6$ and $R_7$ or $R_8$ and $R_9$ may link to each other to form a 5-membered or 6-membered ring. $R_{11}$ and $R_{12}$ which may be identical or different represent alkyl group or aryl group and $R_{11}$ and $R_{12}$ may link to each other to form a 5-membered or 6-membered ring. Y represents sulfur atom, oxygen atom, $>N-R_{13}$ ($R_{13}$ is an alkyl group). X represents an acid anion. l, m, n, p and q represent 1 or 2.

As typical examples of $Z_1$ and $Z_2$, mention may be made of nitrogen containing heterocyclic rings such as thiazole, benzothiazole, naphtho[1,2-α]thiazole, naphtho-[2,1-α]thiazole, naphtho[2,3-α]thiazole, selenazole, benzoselenazole, naphtho[2,1-α]selenazole, naphtho[1,2-α]-selenazole, oxazole, benzooxazole, naphtho[1,2-α]oxazole, naphtho[2,1-α]oxazole, naphtho[2,3-α]oxazole, 2-quinoline, 4-quinoline, 3,3-dialkylindolenine, imidazole, benzimidazole, naphtho[1,2-α]imidazole, pyridine, etc. These heterocyclic rings may have at least one substituent such as alkyl group (e.g., methyl, ethyl, butyl, trifluoromethyl, etc.), aryl group (e.g., phenyl, tolyl, etc.), hydroxyl group, alkoxy group (e.g., methoxy, ethoxy, butoxy, etc.), carboxyl group, alkoxycarbonyl group (e.g., methoxycarbonyl, ethoxycarbonyl, etc.), halogen atom (e.g., fluorine, chlorine, bromine and iodine), aralkyl group (e.g., benzyl, phenethyl, etc.), cyano group, alkenyl group (e.g., allyl, etc.), etc.

For $R_1$ and $R_2$, as examples of alkyl groups, mention may be made of lower alkyl groups such as methyl, ethyl, propyl, butyl, etc., hydroxyalkyl groups such as β-hydroxyethyl, γ-hydroxypropyl, etc., alkoxyalkyl groups such as β-methoxyethyl, γ-methoxypropyl, etc., acyloxyalkyl groups such as β-acetoxyethyl, γ-acetoxypropyl, β-benzoyloxyethyl, etc., carboxyalkyl groups such as carboxymethyl, β-carboxyethyl, etc., alkoxycarbonylalkyl groups such as methoxycarbonylmethyl, ethoxycarbonylmethyl, β-ethoxycarbonylethyl, etc., sulfoalkyl groups such as β-sulfoethyl, γ-sulfopropyl, δ-sulfobutyl, etc., aralkyl groups such as benzyl, phenethyl, sulfobenzyl, etc. Alkenyl groups include, for example, allyl group, etc.

As $R_3$, there may be used alkyl groups and alkenyl groups as exemplified for $R_1$ and $R_2$ hereabove and besides, aryl groups such as phenyl, tolyl, methoxyphenyl, chlorophenyl, naphthyl, etc.

As $R_4$–$R_{10}$, there may be used hydrogen atom, halogen atoms (e.g., chlorine, bromine, iodine and fluorine), alkyl groups and aryl groups as exemplified for $R_1$ and $R_2$ and alkoxy groups having alkyl group as exemplified for $R_1$ and $R_2$ (i.e., $OR_1$ group) and the 5-membered or 6-membered rings formed by $R_6$ and $R_7$ or $R_8$ and $R_9$ may be substituted with lower alkyl group, etc. $R_{11}$ and $R_{12}$ are the same alkyl and aryl groups as enumerated for $R_1$ and $R_2$ and $R_{11}$ and $R_{12}$ may link to each other to form a 5-membered or 6-membered ring. As $R_{13}$, mention may be made of alkyl groups as exemplified for $R_1$ and $R_2$.

The acid anions of X include, for example, alkylsulfate ions such as methylsulfuric acid, ethylsulfuric acid, etc., thiocyanate ion, toluenesulfonate ion, halogen ions such as chlorine, bromine, iodine, etc. perchlorate ion, etc. and this acid anion is absent when the dye has the structure similar to betaine.

Typical examples of sensitizing dyes used in this invention are enumerated below.

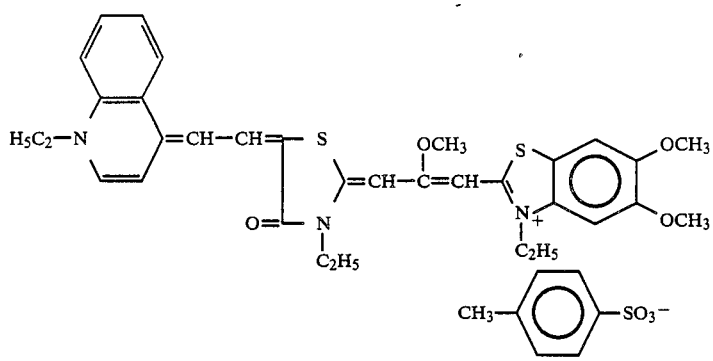
(1)
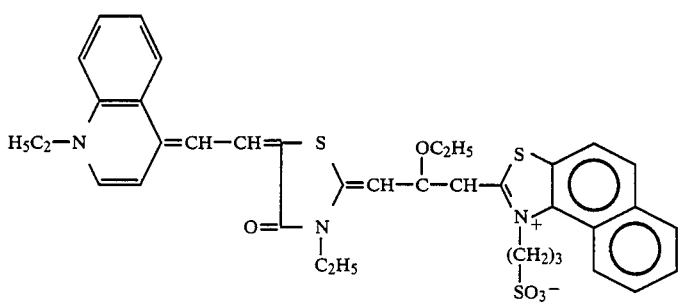
(2)
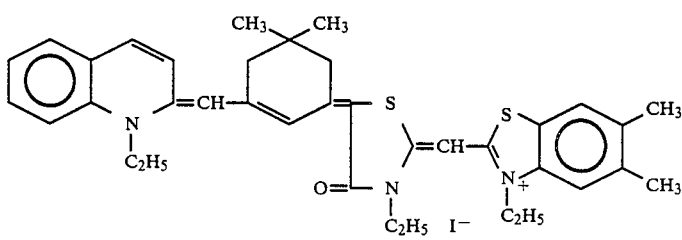
(3)
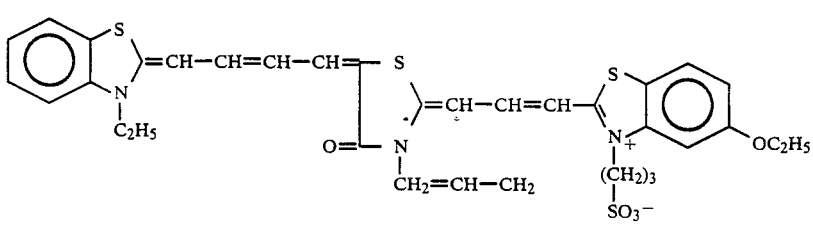
(4)
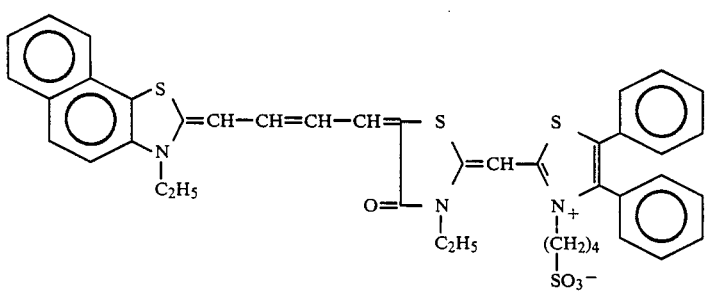
(5)
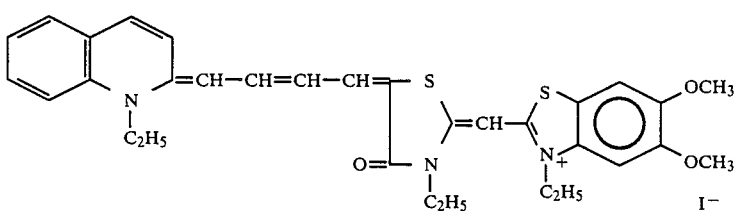
(6)

-continued
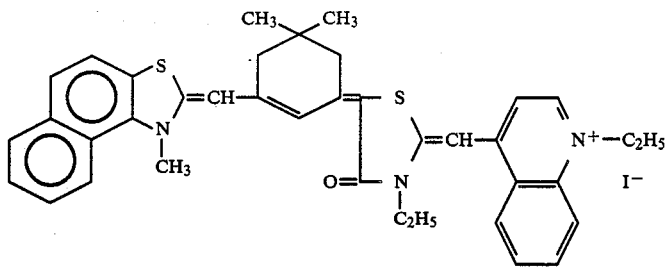
(7)
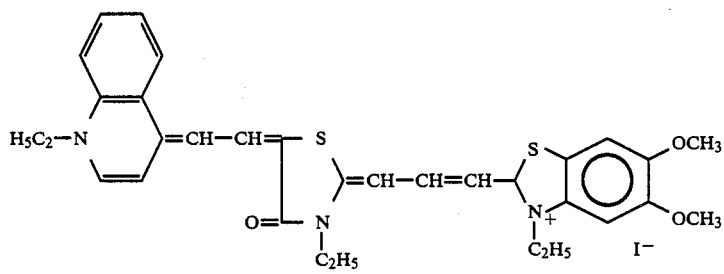
(8)
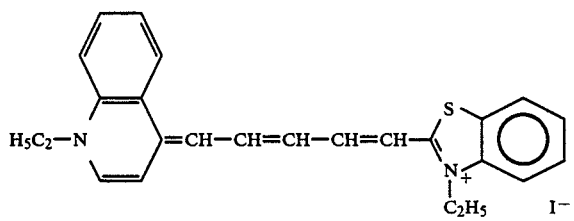
(9)
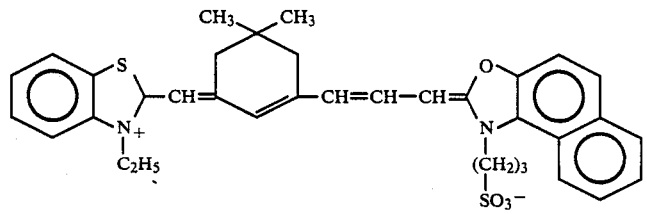
(10)
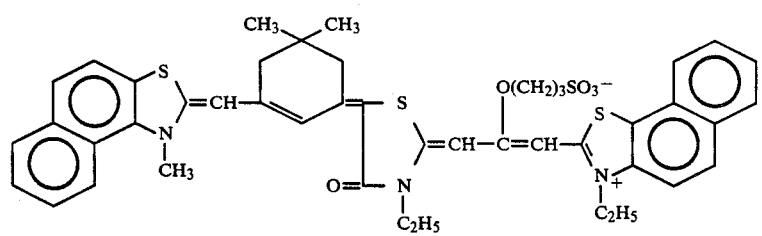
(11)
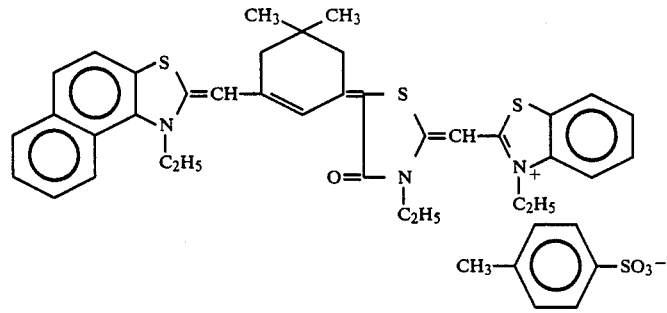
(12)

-continued
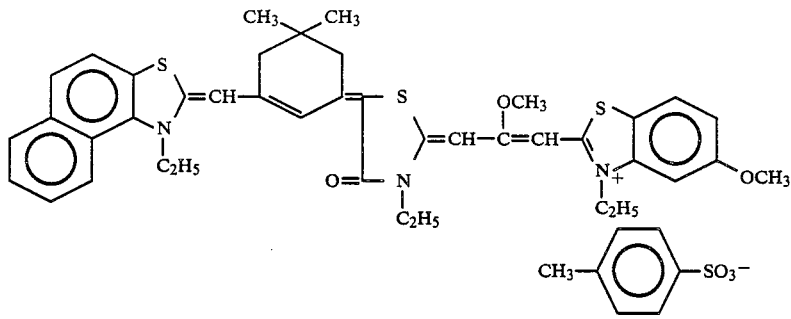 (13)
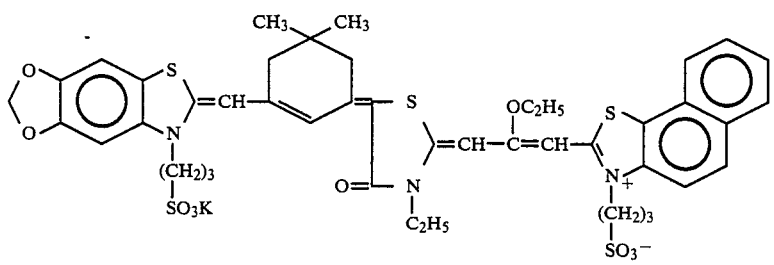 (14)
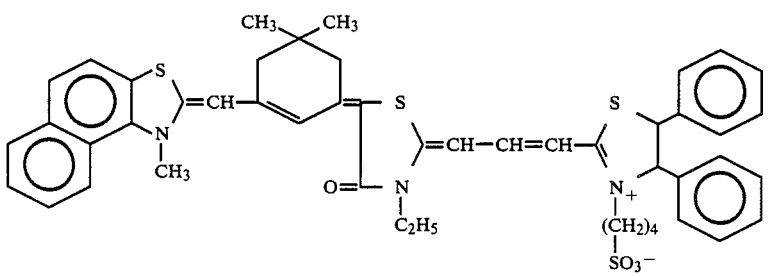 (15)
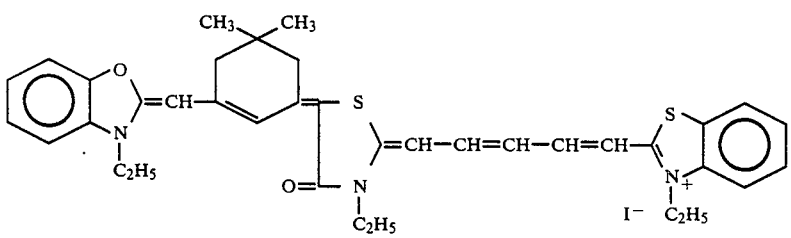 (16)
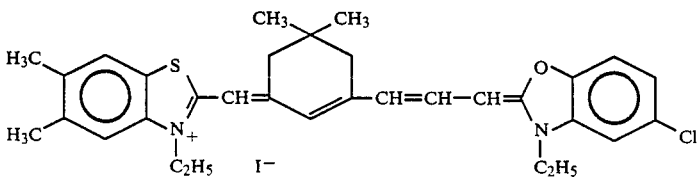 (17)
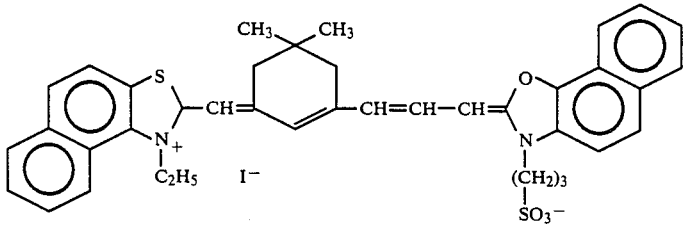 (18)

-continued
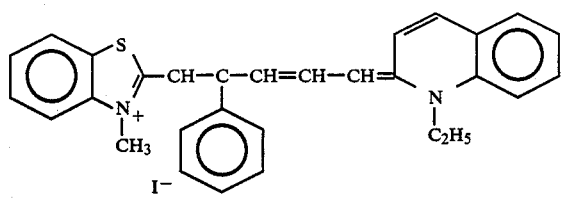
(19)
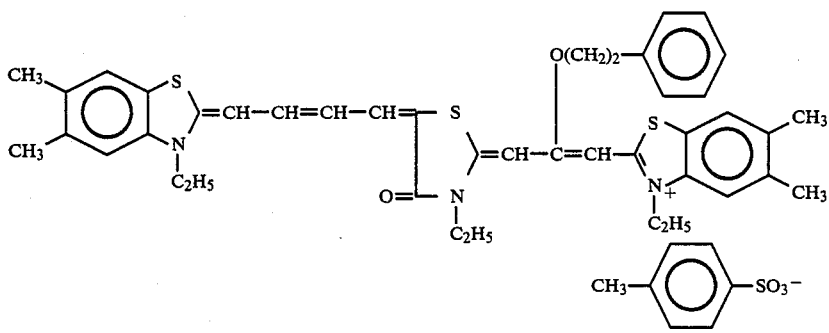
(20)
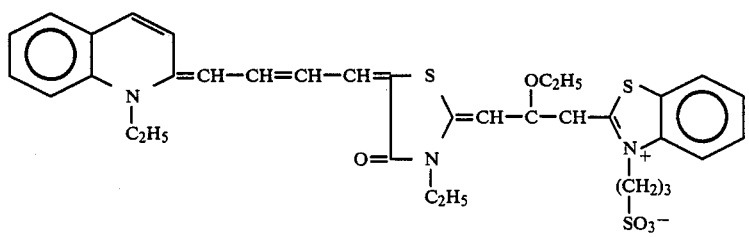
(21)
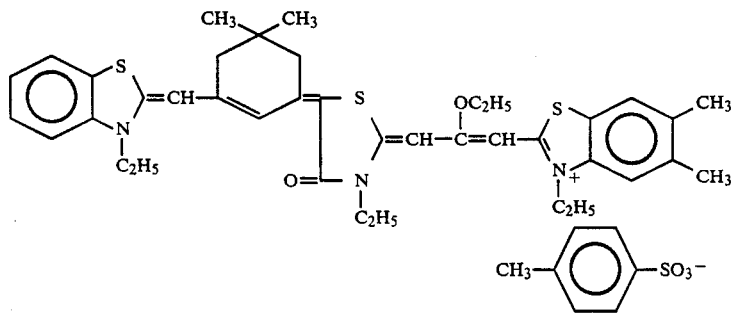
(22)
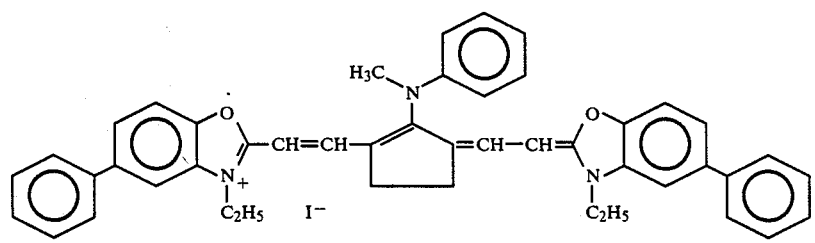
(23)

-continued
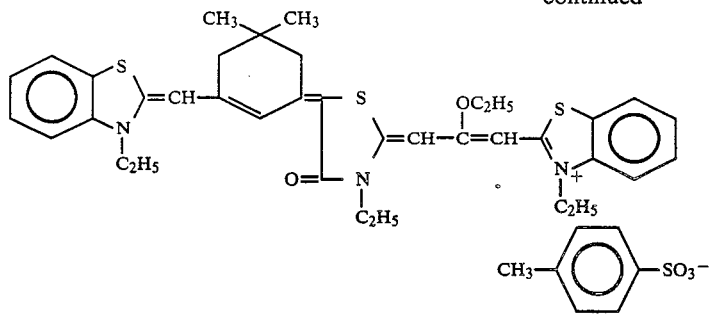
(24)
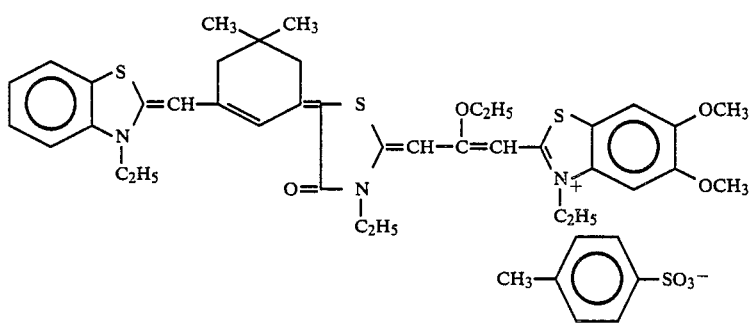
(25)
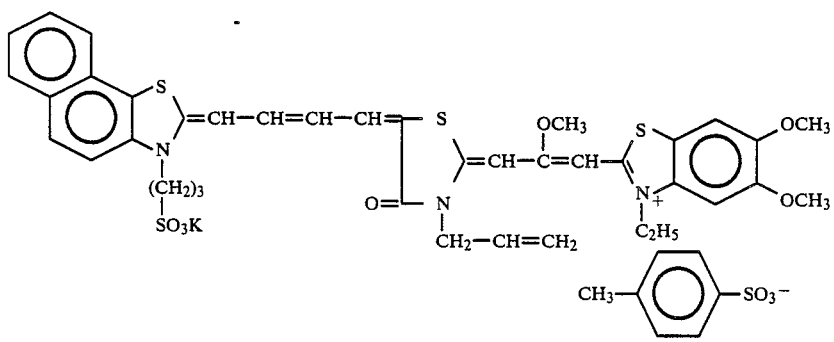
(26)
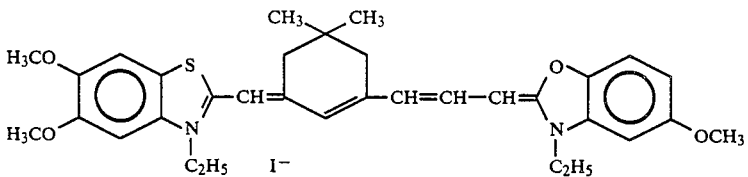
(27)
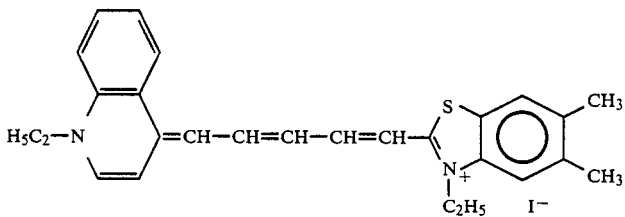
(28)
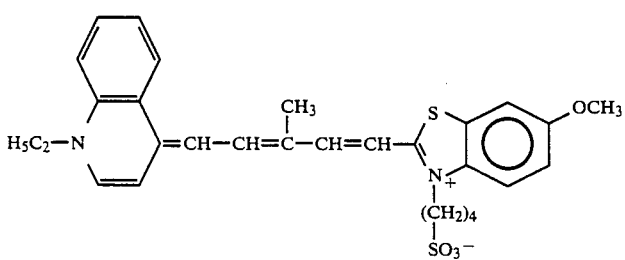
(29)

-continued

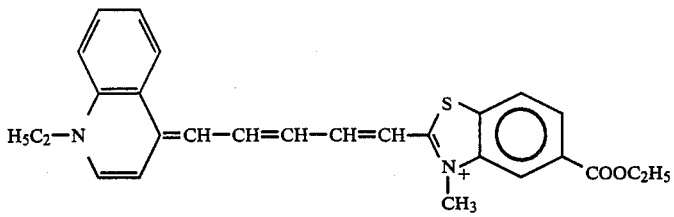

(30)

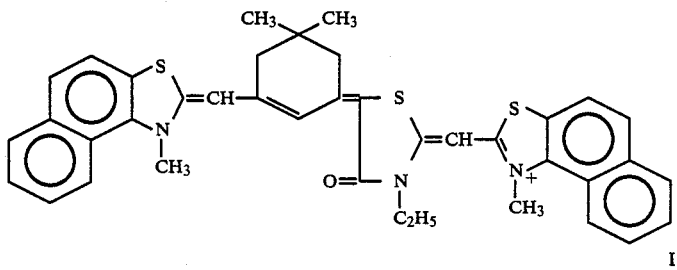

(31)

The sensitizing dyes used in this invention can be synthesized by the methods known in the art. The sensitizing dyes may be added to silver halide emulsion at any time before coating the emulsion.

The silver halide emulsions used in this invention include silver chloride, silver chloroiodide, silver chlorobromide and silver chloroiodobromide which contain 50 mol% or more, preferably about 70 mol% or more of silver chloride. Silver iodide is preferably within the range of about 0.01-about 3 mol%. Average grain size of these silver halides is in the range of 0.2-0.6 μm, preferably 0.25-0.5 μm. The silver halides are preferably monodispersion of silver halide grains, 90% or more of total grains having a size within ±30% of the average size. The grains are preferably in the form of substantially cube or fourteenfaced polyhedron, though those having other crystal habits may also be used. The binder used in the silver halide emulsion of the lithographic printing plate of this invention is usually gelatin which can be partially replaced by one or more hydrophilic polymer binders such as starch, albumin, sodium alginate, hydroxyethylcellulose, gum arabic, polyvinyl alcohol, polyvinyl pyrrolidone, carboxymethylcellulose, polyacrylamide, styrene-maleic anhydride copolymer, and polyvinyl methyl ether-maleic anhydride copolymer. It is further possible to use an aqueous dispersion (latex) of vinyl polymers.

The silver halide emulsion can be sensitized by various methods during preparation or coating. Preferably, it is chemically sensitized by the methods well known to the art by using, for example, sodium thiosulfate, alkylthioureas or gold compounds such as gold rhodanide and gold chloride or by combination of them. Characteristics such as high sensitivity, high sharpness and high resolving power preferable for direct making of printing plates may be obtained by adding at any time during preparation of silver halide emulsion compounds of metals of Group VIII of the periodic table such as salts of cobalt, nickel, rhodium, palladium, iridium, platinum, etc. Amount of these compounds is within the range of $10^{-8}-10^{-3}$ mol per 1 mol of silver halide. The silver halide emulsion layer may additionally contain other additives such as coating aids, hardeners, antifogants, developing agents, etc.

An image receiving layer is provided above the silver halide emulsion layer, namely, as an uppermost surface layer. When it is provided underneath the emulsion layer, the effect of this invention is not exhibited or is small, if any.

As physical development nuclei, mention may be made of known ones such as metals including antimony, bismuth, cadmium, cobalt, palladium, nickel, silver, lead and zinc and sulfides thereof. The image receiving layer may contain one or more of hydrophilic colloids such as gelatin, carboxymethyl cellulose, gum arabic, sodium alginate, hydroxyethyl starch, dialdehyde starch, dextrin, hydroxyethyl cellulose, polystyrenesulfonic acid, vinylimidazole-acrylamide copolymer, polyvinyl alcohol, etc. The hydrophilic colloid contained in the image receiving layer is preferably in an amount of 0.5 g/m² or less.

The image receiving layer may contain hygroscopic substances, e.g., wetting agents such as sorbitol, glycerol, etc. The image receiving layer may further contain pigments for prevention of scumming such as barium sulfate, titanium dioxide, china clay and silver, developing agents such as hydroquinone and hardeners such as formaldehyde and dichloro-S-triazine.

The DTR processing solution used in this invention may contain 2-mercaptobenzoic acid and cyclic imides (e.g., uracil) disclosed in U.S. Pat. Nos. 4,297,429, 4.297,430 and 4,355,090, silver halide solvents such as thiosulfates; alkaline agents such as sodium hydroxide, potassium hydroxide, lithium hydroxide, and trisodium phosphate; preservatives such as sodium sulfite and potassium sulfite; thickening agents such as hydroxyethyl cellulose and carboxymethyl cellulose; antifogants such as potassium bromide, 1-phenyl-5-mercaptotetrazole and benzotriazol; compounds disclosed in Japanese Patent Unexamined Publication (Kokai) No. 26201/72; developers such as hydroquinone and 1-phenyl-3-pyrazolidone; development modifiers such as polyoxyalkylene compounds and onium compounds, etc.

In carrying out the silver complex diffusion transfer process, silver halide emulsion layer and/or image receiving layer or other water permeable layers contiguous to the image receiving layer may contain a developing agent as described in British Pat. Nos. 1,000,115, 1,012,476, 1,017,273 and 1,042,477. Therefore, in using such light sensitive materials, the processing solution used in the developing stage may be so-called "alkaline activating solution" containing no developing agent.

The lithographic printing plates made by this invention may be rendered ink receptive or enhanced in ink receptivity by use of such compounds described in Japanese Patent Examined Publication (Kokoku) No. 29723/73 and U.S. Pat. No. 3,721,539.

The printing method, and etch solution and damping solution used therefor may be those well known to the art.

The following nonlimiting examples illustrate this invention.

EXAMPLE 1

On one side of a support which was coated on both sides with polyethylene resin was provided a matting layer containing silica particles of $5\mu$ in average particle size. On another side was provided an undercoat (adjusted to pH 4.5) containing carbon black and phenidone and 20% by weight (based on photographic gelatin) of silica powders of 7 $\mu$m in average particle size. On this undercoat was provided a silver halide emulsion layer (adjusted to pH 4.5) containing 2-mercaptobenzoic acid and 5% by weight (based on photographic gelatin) of silica powders of 7 $\mu$m in average particle size after having been chemically sensitized with a gold compound and hypo.

The silver halide emulsion contained the sensitizing dye (13) exemplified hereinbefore in an amount of $5.4 \times 10^{-4}$ mol per 1 mol of silver halide and further contained $5 \times 10^{-7}$ mol of iridium for 1 mol of silver halide which had been added during physical ripening of the emulsion. The silver halide grains were silver chloride crystals in substantially cubic form and were $0.35\mu$ in average grain size and 90% or more of the total grains were distributed within the range of $\pm 30\%$ of the average grain size. Application rate of gelatin in the undercoat was 3.0 g/m$^2$, that of gelatin in the emulsion layer was 1.0 g/m$^2$ and that of silver halide was 1.0 g/m$^2$ in terms of silver nitrate. The undercoat and the emulsion layer contained 5.0 mg of formalin as a hardener for 1 g of gelatin.

Optical reflection density of the undercoat for 780 nm was 1.34. After drying, the sample was heated at 40° C. for 14 days. The emulsion layer was then coated with a nuclei coating composition [used for plate No. 11 in Example 1 of Japanese Patent Unexamined Publication (Kokai) No. 103104/79 to which 0.8 g/m$^2$ of hydroquinone was added] (Thus obtained sample was called lithographic printing plate A).

On the other hand, lithographic printing plate B was prepared in the same manner as in production of A except that the optical reflection density of the undercoat was 0.78.

These lithographic printing plates in close contact with a film block copy original containing fine line images were exposed for $10^{-5}$ second to a light source to which a dark red filter (SC-70 manufactured by Fuji Photo Film Co.) which transmitted a light longer than about 700 nm was attached.

These were used as samples for printing test.

Further, exposure was effected in the same manner as above using an wedge of 0.15 in density difference. These were used as samples for sensitometry.

Each of these samples imagewise exposed was developed with the following DTR developer at 25° C. for 30 seconds. After the development, the plate was passed through a pair of squeeze rolls to remove the excess developer, immediately thereafter was treated with a neutralizer of the following composition at 25° C. for 20 seconds, again passed through squeeze rolls to remove the excess liquid and dried at room temperature.

| DTR developer | |
|---|---|
| Water | 700 ml |
| Sodium hydroxide | 18 g |
| Potassium hydroxide | 7 g |
| Anhydrous sodium sulfite | 50 g |
| 2-mercaptobenzoic acid | 1 g |
| Uracil | 10 g |
| 2-methylaminoethanol | 30 ml |
| 5-phenyl-2-mercapto-1,3,4-oxadiazole | 0.1 g |
| Potassium bromide | 1 g |
| Water to make up 1 l. | |
| Neutralizer | |
| Water | 600 ml |
| Citric acid | 10 g |
| Sodium citrate | 35 g |
| Colloidal silica (20% solution) | 5 ml |
| Ethylene glycol | 5 ml |
| Water to make up 1 l. | |

Printing endurance was evaluated as follows: Each of samples for printing test was pasted on one sheet and this sheet was mounted on an offset printing machine, then applied with the following etch solution all over the surface and printing was run using the following damping solution. The printing endurance shown in Table 1 and Table 2 was evaluated in terms of the number of copies delivered before the printing had become impossible due to the occurrence of summing or partial disappearance of silver image.

The printing machine used was A.B.Dick 350CD (tradename for an offset printing machine supplied by A.B.Dick Co.).

| Etch solution | |
|---|---|
| Water | 600 ml |
| Isopropyl alcohol | 400 ml |
| Ethylene glycol | 50 g |
| 3-mercapto-4-acetamido-5-n-heptyl-1,2,4-triazole | 1 g |
| Damping solution | |
| o-Phosphoric acid | 10 g |
| Nickel nitrate | 5 g |
| Sodium nitrite | 5 g |
| Ethylene glycol | 100 g |
| Colloidal silica (20% solution) | 28 g |
| Water to make up 2 l. | |

In the same manner as above, printing was also carried out using the samples for sensitometry. The lithographic printing plate B showed the high sensitivity of 2.5 times that of the lithographic printing plate A in terms of difference in sensitivity shown by the number of steps of wedge which received the printing ink while printing endurance of the samples for printing test was more than 10,000 copies for plate A and 6,000 for plate B.

Lithographic printing plates A and B were made using laser beam by a laser diode scanner, Ultra Setter (manufactured by Ultre Co. of U.S.A.) which emits light of 780 nm to find that not only the lithographic printing plate A, but also B could not provide satisfactory images under the condition of maximum output.

Next, lithographic printing plates were made in the same manner as in production of lithographic printing plate B except that the sensitizing dye (13) was used in an amount of $1 \times 10^{-3}$ mol (lithographic printing plate C), $2.7\times10^{-4}$ mol (D) or $9\times10^{-5}$ mol (E) for 1 mol of silver halide and the resulting samples were tested in the same manner as above.

Relative sensitivity when sensitivity of lithographic printing plate A is assumed to be 100 and printing endurance are shown in Table 1.

TABLE 1

| Lithographic printing plate | Sensitivity | Printing endurance (number of copies) |
| --- | --- | --- |
| A | 100 | 10,000 or more |
| B | 250 | 6,000 |
| C | 150 | 5,000 |
| D | 500 | 8,000 |
| E | 600 | 8,000 |

Printing plates B-E were inferior to printing plate A in resolving power in contact exposure and besides were low in printing endurance as shown in Table 1. However, printing plates D and E could provide satisfactory images with exposure by Ultre Setter and had printing endurance of more than 10,000 copies and good resolving power.

EXAMPLE 2

Example 1 was repeated except that sensitizing dye (22) was used in place of sensitizing dye (13) to obtain the similar results to those of Example 1.

EXAMPLE 3

Example 1 was repeated except that sensitizing dye (2) was used in place of dye (13) to obtain the similar results to those of Example 1.

EXAMPLE 4

Lithographic printing plates were made in the same manner as in production of lithographic printing plate B in Example 1 except that the sensitizing dye (13) was added in an amount of $6\times10^{-5}$ mol (lithographic printing plate F), $3\times10^{-5}$ mol (G) or $1\times10^{-5}$ mol (H) for 1 mol of silver halide and subjected to the same tests as in Example 1.

Printing plate F showed the similar results to those of printing plate E and printing plate G showed the similar results to those of printing plate D.

Printing plate H was similar to printing plate A in sensitivity and when reflectance of antihalation was increased to enhance sensitivity, printing endurance was conspicuously deteriorated.

EXAMPLE 5

Lithographic printing plates were made in the same manner as in making lithographic printing plate E in Example 1 except that reflection density of the undercoat was changed to 0.58 (lithographic printing plate I) and 0.32 (lithographic printing plate J) and were subjected to the same tests as in Example 1.

Lithographic printing plate I was higher in sensitivity than lithographic printing plate E and showed substantially no reduction in resolving power and was similar to E in printing endurance.

Lithographic printing plate J was higher in sensitivity than lithographic printing plate I, but was markedly deteriorated in resolving power and fine line silver images disappeared before printing of 5,000 copies in both plates subjected to contact exposure and exposure by Ultre Setter.

EXAMPLE 6

Lithographic printing plates K and L (comparative) were made in the same manner as in production of lithographic printing plate A of Example 1 except that the silver halide emulsion contained sensitizing dye (17) in an amount of $1.0\times10^{-4}$ mol per 1 mol of silver halide, iridium was added in an amount of $5\times10^{-7}$ mol per 1 mol of silver halide during physical ripening, the silver halide was silver chloride of substantially cubic form having an average gain size of 0.42 micron, 90% or more of total grains had a size within ±30% of the average grain size and reflection density of the undercoat was 0.65 (printing plate K) and 0.34 (L).

Further, lithographic printing plate M of this invention was made by adding 1.3 $g/m^2$ of titanium dioxide (to provide reflection density of 0.62) to the undercoat of the above lithographic printing plate K and comparative lithographic printing plate N by adding 1.3 $g/m^2$ of titanium dioxide (to provide reflection density of 0.32) to the undercoat of the above lithographic printing plate L.

The resulting printing plates were subjected to the same tests as of Example 1 and the results are shown in Table 2. The relative sensitivity was shown by assuming the sensitivity of printing plate K to be 100.

TABLE 2

| Printing plate | Relative sensitivity | Printing endurance | |
| --- | --- | --- | --- |
| | | Disappearance of silver | Scumming |
| K | 100 | 5,000 | 6,000 |
| L | 230 | 3,000 | 6,000 |
| M | 110 | 7,000 | 8,000 |
| N | 250 | 4,000 | 8,000 |

According to this invention, it becomes possible to obtain a lithographic printing plate substantially free from reduction of resolving power and high in sensitivity and printing endurance using silver complex diffusion transfer process in direct plate making of semiconductor laser diode scanner system.

What is claimed is:

1. A method for making a lithographic printing plate utilizing silver complex diffusion transfer process which comprises subjecting to scanning exposure of highintensity short-time a light sensitive material comprising a support and, provided thereon, at least a silver halide emulsion layer and a physical development nuclei layer as a surface layer and then developing it with a silver complex diffusion transfer developer, the improvement which comprises subjecting the light sensitive material to imagewise exposure with scanning light of at least 700 nm, said emulsion layer containing silver halide grains mainly composed of silver chloride and a sensitizing dye having a sensitivity maximum in the long wavelength region of at least 700 nm in an amount of $3\times10^{-5}$-$3\times10^{-4}$ mol for 1 mol of silver halide and an antihalation means being provided below said emulsion layer to provide a reflectance of 13-40% for the scanning exposure light of at least 700 nm.

2. A method according to claim 1 wherein the reflectance to be provided by the antihalation means is 14-35%.

3. A method according to claim 1 wherein an undercoat is provided between the support and the emulsion layer.

4. A method according to claim 3 wherein the antihalation layer is provided at at least one of the undercoat, the support or backing layer.

5. A method according to claim 4 wherein the antihalation means is to add to at least one of the layers a material which can absorb a scanning light of at least 700 nm.

6. A method according to claim 1 wherein the amount of the sensitizing dye is $4\times 10^{-4} - 2\times 10^{-4}$ mol for 1 mol of silver halide.

7. A method according to claim 1 wherein the sensitizing dye is represented by the following general formula (I), (II), (III) or (IV):

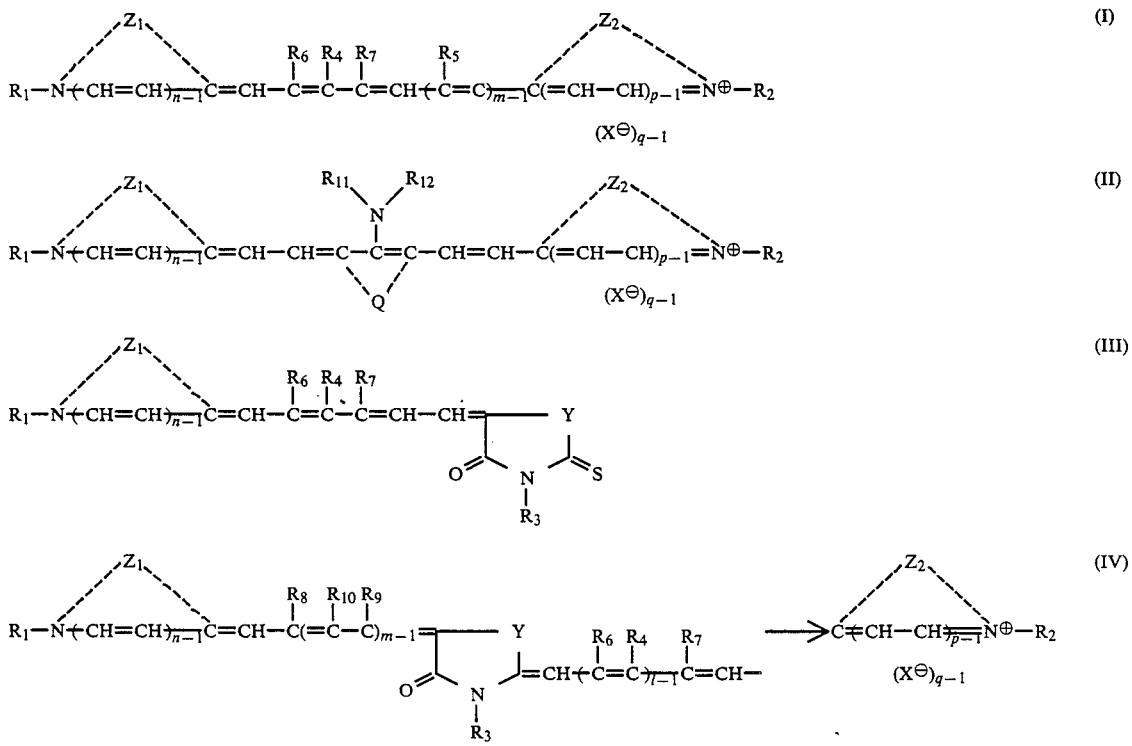

wherein $Z_1$ and $Z_2$ which may be identical or different represent atom group necessary for formation of 5-membered or 6-membered nitrogen containing heterocyclic ring; $R_1$ and $R_2$ which may be identical or different represent alkyl group or alkenyl group; $R_3$ represents alkyl group, alkenyl group or aryl group; $R_4$–$R_{10}$ which may be identical or different represent hydrogen atom, halogen atom, alkyl group, aryl group or alkoxy group and $R_6$ and $R_7$ or $R_8$ and $R_9$ may link to each other to form a 5-membered or 6-membered ring; $R_{11}$ and $R_{12}$ which may be identical or different represent alkyl group or aryl group and $R_{11}$ and $R_{12}$ may link to each other to form a 5-membered or 6-membered ring; Y represents sulfur atom, oxygen atom, >N-$R_{13}$ ($R_{13}$ is an alkyl group); X represents an acid anion; and l, m, n, p and q represent 1 or 2.

* * * * *